United States Patent [19]
McConnell et al.

[11] Patent Number: 4,641,378
[45] Date of Patent: Feb. 3, 1987

[54] FIBER OPTIC COMMUNICATION MODULE

[75] Inventors: Matthew L. McConnell, Boulder; William A. Gibson, Lafayette, both of Colo.

[73] Assignee: Raycom Systems, Inc., Boulder, Colo.

[21] Appl. No.: 617,905

[22] Filed: Jun. 6, 1984

[51] Int. Cl.[4] ............................................. H04B 9/00
[52] U.S. Cl. .................................... 455/619; 330/59; 330/311; 455/607; 455/608; 455/612; 455/613; 455/618
[58] Field of Search ............... 455/601, 603, 606, 607, 455/608, 609, 612, 613, 617, 618, 619; 372/25, 30, 38; 330/59, 308, 311, 292; 370/3, 4; 250/214 A, 214 AG, 214 DC

[56] References Cited
U.S. PATENT DOCUMENTS

| | | | |
|---|---|---|---|
| 3,240,944 | 3/1966 | Wolfson et al. | 250/214 A |
| 4,095,097 | 6/1978 | Reeve | 455/608 |
| 4,161,650 | 7/1979 | Caouette et al. | 455/612 |
| 4,166,947 | 9/1979 | Dirksen | 455/613 |
| 4,281,253 | 7/1981 | Culver | 350/96.16 |
| 4,441,180 | 4/1984 | Schussler | 455/612 |

OTHER PUBLICATIONS

Goldberg et al—"A One Mile Half-Duplex"—Comm. International, vol. 6, #7, Jul. 1979, pp. 52, 53.
Medved—Fiber Computer Links—Laser Focus—Apr. 1980, pp. 66, 68, 69.
Lineback—"Master Slice Approach"—Electronics—May 19, 1981, vol. 54, No. 10, pp. 39, 40.
McAleer—Emitter Peaking"—Electronics—Sep. 4, 1967—p. 96.
Allard et al—Multichannel Fiber Optic Sonar Link (FOSL-1)—May 16-20, 1977—Conf: Electromagnetic Wave Propagation Panel/Avionic Panel Joint Symposium, London, England, pp. 13-1 to 13-7.
Dainichi—Nippon Cables Review (Japan)—May 1980—No. 66, "Fiber Optics Appliances", pp. 48-52.

*Primary Examiner*—Joseph A. Orsino, Jr.
*Attorney, Agent, or Firm*—Jerry W. Berkstresser

[57] ABSTRACT

A connector compatible fiber optic replacement module for use in a local area network coaxial hub for direct communication with TTL level signals to provide a fiber optic communication link. The system uses a first amplification stage having a circuit design which provides a precisely controlled input impedance to allow unit to unit repeatability of response of the circuit in a simple and easy manner. High-frequency response of the circuit is provided by a cascode transistor pair configuration which limits the effects of virtual capacitance. Direct coupled biasing is employed throughout the receiver circuit to limit the number of components utilized. The transmitter circuit employs a standard TTL open collector driver circuit used in peripheral units to drive an infra red LED for transmission over fiber optic communication link.

1 Claim, 15 Drawing Figures

20 FIRST AMPLIFCATION STAGE

FIBER OPTIC COMMUNICATION MODULE

BACKGROUND OF THE INVENTION

The present invention pertains generally to fiber optic communication devices and more particularly to modular transceiver units for use in a local area network hub.

With the increasing use of programmable data processing apparatus, local area networks for communicating between central processing units, terminals, peripherals, etc., have gained wide acceptance and increased use. Typical local area networks such as the ARC-NET ® (a registered trademark of the Data Point Corporation) local area network system employ co-axial cables as a communication link between spatially separated units in the system. Typical co-axial cable local area networks utilize active hubs which have a plurality of co-axial cable ports for connecting one or more devices which communicate within the local area network. Each of the co-axial ports is connected to an electronic modular package which processes the signal for communication with the local area network.

Fiber optic communication links provide a significant advantage over co-axial communication links because of the immunity of fiber optic links to electromagnetic interference and radio frequency interference, increased bandwidth over length, which increases data communication distance for the same speed, and increased security from unauthorized tapping of the network. Also, optical fibers will soon be lower in cost than wire. Consequently, it would be desirable to provide a pin compatible module for use in an active hub, wire concentrator, terminal device, and other devices, to replace co-axial cable communication ports with a fiber optic communication ports to provide the ability to communicate through one or more ports with fiber optic links. Such a system would, however, be limited by the space provided in an active hub, wire concentrator, terminal device, or other similar devices so that the number and size of components in such a compatible module would be limited. Additionally, because of established connector configurations of devices in which an electronic module could be used, problems of cross-talk and virtual capacitance at the high frequencies of operation of the system must necessarily be overcome because of the inability to change the pin configuration of the connector configuration which was designed for coaxial communications.

SUMMARY OF THE INVENTION

The present invention overcomes these disadvantages and limitations by providing a pin compatible module for fiber optic communication in a local area network. The present invention utilizes a bidirectional coupler which allows a single fiber link cable to replace a single coaxial cable or a single twisted pair cable. The present invention additionally supports full duplex communication over a single fiber, allowing a single fiber link cable to replace two coaxial cables or dual twisted pairs in ring networks such as IEEE's proposed 802.5 token ring. A cascode transistor pair configuration is used in each of the first and second stages of amplification to limit virtual capacitance and consequently provide a high-frequency response of the circuit. Emitter degeneration is used to precisely control the amplification in both the first and second amplification stages. Emitter degeneration is used in conjunction with negative feedback in the first amplification stage to precisely control input impedance to match the frequency response of the PIN diode and provide repeatability of response from unit to unit in a production line process in a simple and easy manner.

The present invention may, therefore, comprise a fiber optic transceiver module for use in a terminal device to replace the physical layer of the open system interconnect of the terminal device and provide a fiber optic communication port in the terminal device comprising receiver circuit means for receiving fiber optic input signals and transforming the fiber optic signals into electrical input signals; transmitter circuit means for transmitting fiber optic output signals in response to electrical output signals; combined coupler/connector means for providing bidirectional optical coupling of the fiber optic input signals and the fiber optic output signals in a half duplex fashion over a single fiber optic link cable.

The present invention may also comprise a local area network hub capable of providing fiber optic communication ports comprising modular transceiver connector means having a plurality of connector devices for connecting modular transceiver units to the modular transceiver connector means to provide a plurality of communication ports in the local area network hub; fiber optic transceiver module means having a connector configuration for connection with the connector devices to provide at least one fiber optic communication port in the local area network hub.

The present invention may also comprise a receiver circuit for a fiber optic receiver apparatus comprising detector means for transforming optical input signals received on a fiber optic link cable into electrical signals; first amplification means for providing a first input impedance and a first predetermined amplification of the electrical signals comprising transistor means arranged in a cascode configuration for providing a high frequency response of the first amplification means by minimizing the effects of virtual capacitance in the transistor pair; emitter degeneration means for precisely controlling gain of the cascode configuration; negative feedback means for precisely controlling input impedance of the first amplification stage in response to the gain of the cascode configuration to provide a uniform response of the receiver circuit for response variations in response of the detector means; second amplification means for providing a second predetermined amplification of the electrical signals, the second amplification means having a cascode transistor pair configuration for providing a high frequency response of the second amplification means by minimizing effects of virtual capacitance in the transistor pair; impedance converter means for providing a high input impedance to the second amplification stage, a low output impedance and a predetermined amplification of the electrical signals; comparison means for producing an output signal whenever the electrical signals exceed a predetermined threshold level.

The present invention may also comprise a token ring network comprising wiring concentrator means capable of implementing a ring configuration to communicate information between terminal devices; fiber optic communication module means disposed in the wiring concentrator means and the terminal devices for providing simultaneous bidirectional communication of the information over a single fiber optic link cable between the wiring concentrator means and the terminal devices.

The present invention may also comprise a token bus network comprising hub means for implementing a bus configuration to communicate information between terminal devices; fiber optic communication module means disposed in the hub means and the terminal devices for providing bidirectional communication of the information over a single fiber optic link cable between the hub means and the terminal devices.

OBJECTS OF THE INVENTION

It is therefore an object of the present invention to provide a fiber optic communication module which is compatible with a local area network coaxial driver/receiver.

It is also an object of the present invention to provide a fiber optic communication module having a high frequency response and which is compatible with a local area network coaxial driver/receiver.

Another object of the present invention is to provide a fiber optic communication module for use in a local area network capable of bidirectional and simultaneous bidirectional communication over a single fiber optic link cable.

Additional objects, advantages and other features of the invention are set forth in part in the description which follows and will be understood by those skilled in the art upon examination of the following or may be learned by practice of the invention. The objects and advantages of the invention may be realized and obtained by means of the instrumentalities and combinations particularly pointed out in the appended claims.

BRIEF DESCRIPTION OF THE DRAWINGS

An illustrative and presently preferred embodiment of the invention is shown in the accompanying drawings, wherein.

DETAILED DESCRIPTION OF THE PREFERRED EMBODIMENT

Figure 1:
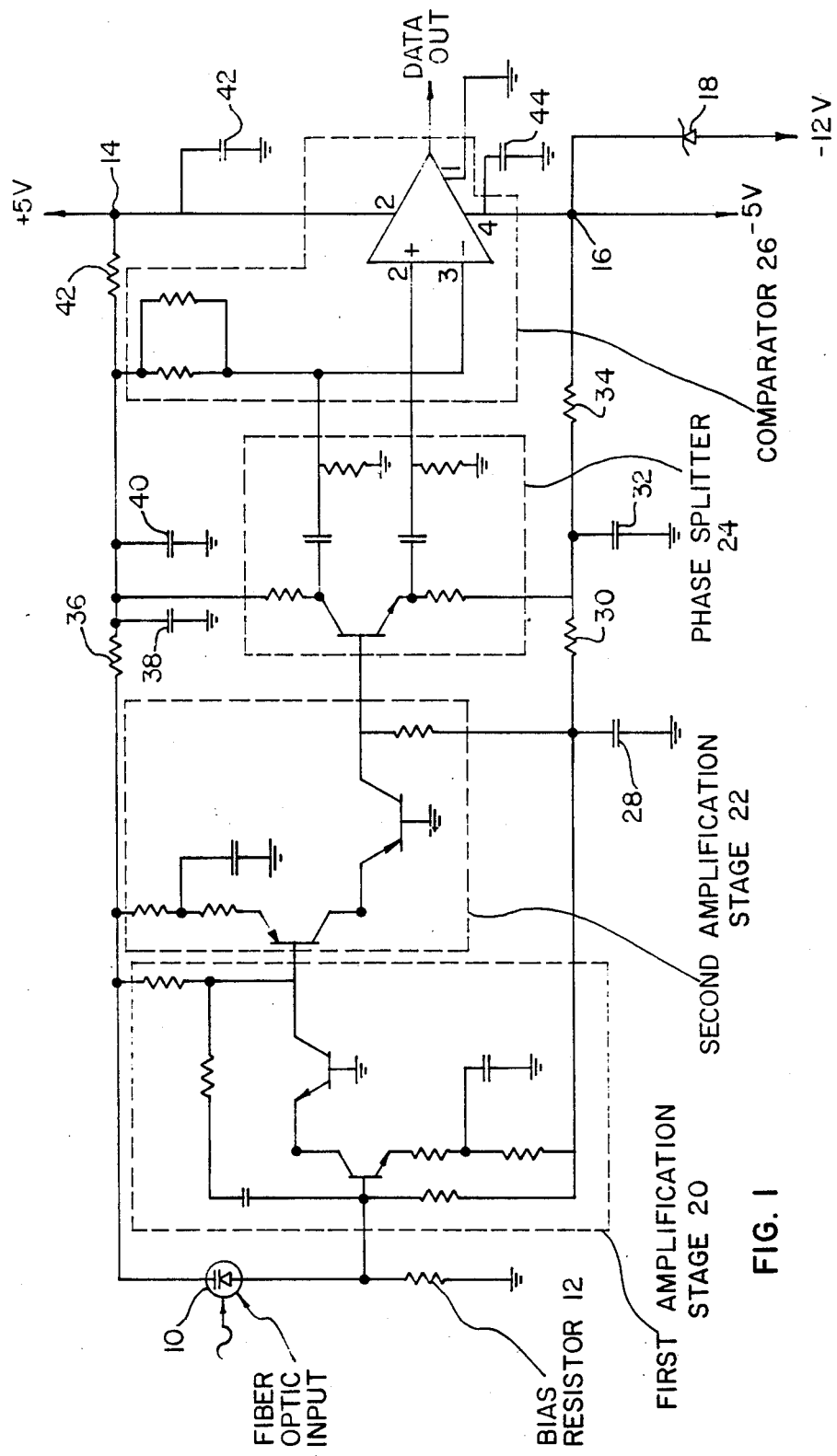
FIG. 1 comprises a schematic circuit diagram of the receiver circuit of the present invention.

FIG. 1 discloses the receiver circuit for the present invention. The receiver circuit is designed for use as a connector compatible fiber optic replacement module for a local area network co-axial line driver/line receiver. Pin diode 10 receives light energy from a fiber optic receiver cable such as disclosed U.S. patent application Ser. No. 552,030, filed Nov. 15, 1963, by Kozman et al. entitled "Fiber Optic Coupling System" which is specifically incorporated herein by reference for all that it discloses. Pin diode 10 is back biased to conduct current proportionally to the amount of light falling on its active areas. Resistor 12, which is approximately 15 k ohms, back biases pin diode 10 in conjunction with a 5 volt biasing voltage provided at node 14 and a −5 volt supply voltage at node 16. A −12 volt dc signal can also be used in conjunction with Zener diode 18 to provide the −5 volt supply at node 16.

Four stages are provided in the receiver circuit illustrated in FIG. 1. The four stages comprise a first amplification stage 20, a second amplification stage 22, an impedance converter stage 24 and a comparator stage 26. To limit the components utilized in the receiver circuit illustrated in FIG. 1, each of the stages is designed so that direct coupled biasing can be employed. Consequently, each of the stages is designed to utilize the dc voltage levels provided in previous stages to eliminate the necessity for additional biasing resistors. This is extremely important in that the number and size of components must be limited due to the size limitations of the pin compatible package in which the receiver circuit of FIG. 1 must be utilized.

First amplification stage 20 uses a cascode transistor pair configuration. Amplification stage 20 is designed as a trans-impedance amplifier which utilizes negative feedback to lower the input impedance of the amplification stage and thereby provide better frequency response. Amplification stage 20 also simultaneously employs emitter degeneration to precisely control the overall gain of the amplification stage and thereby precisely control the input impedance and the frequency response of the circuit.

Second amplification stage 22 also uses a cascode transistor pair configuration employing emitter degeneration to control the amplification of the circuit and thereby provide the desired frequency response.

Impedance converter stage 24 provides a high input impedance to second amplification stage 22 to ensure proper gain and a low output impedance to comparator stage 26 to negate the effects of stray capacitance.

Since the receiver circuit of FIG. 1 is used in a digital environment, the power supply provides a significant amount of noise. Resistive/capacitive pairs utilized in the receiver circuit of FIG. 1 function to shunt different spectral regions of noise to ground. For example, capacitor 28 works in conjunction with resistor 30 to provide an RC time constant which filters out noise from the power supply in a predetermined spectral region. Capacitor 32 functions in conjunction with resistor 34 to filter noise in a different spectral region. On the positive side of the circuit, capacitor 38 works in conjunction with resistor 36, while capacitor 40 works in conjunction with resistor 42 to filter noise from the power supply. Additionally, capacitors 44 and 46 work in conjunction with the resistance of the input leads of the power supply to filter noise.

Figure 2:
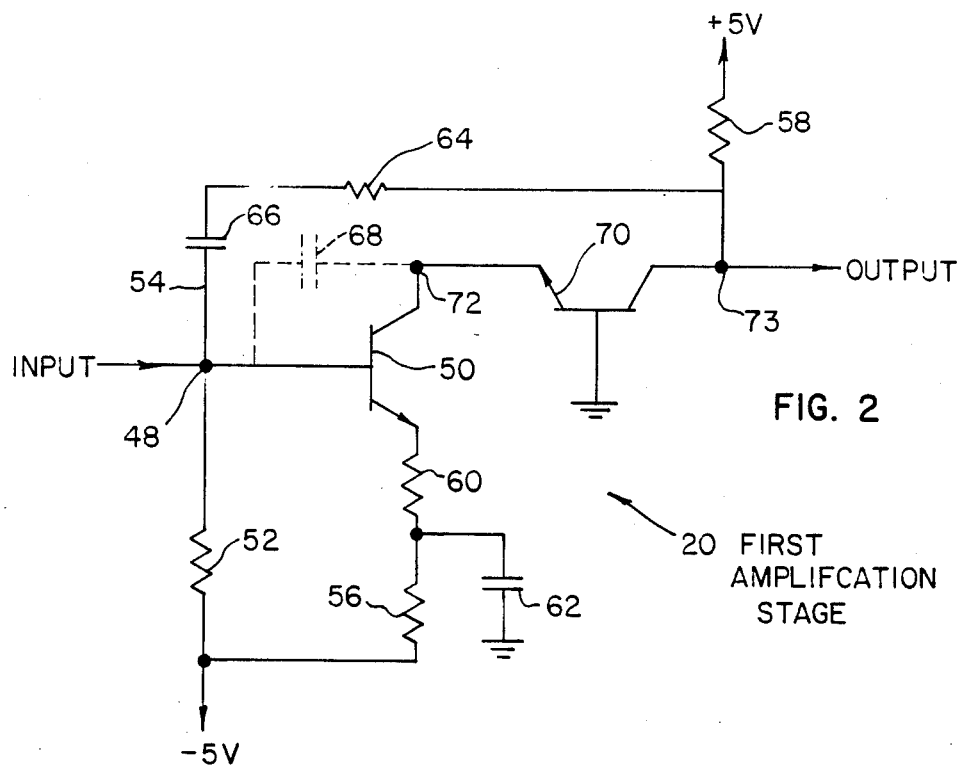
FIG. 2 comprises a schematic circuit diagram of the first amplification stage of the present invention.

FIG. 2 is a circuit diagram of the first amplification stage 20. The input from pin diode 10 is applied to node 48 which is connected to the base lead of transistor 50, biasing resistor 52 and feedback circuit 54. Biasing resistor 52 works in conjunction with biasing resistor 56 to bias the circuit from a −5 volt supply. Resistor 58 functions to bias the circuit from a +5 volt supply. Voltage gain of the circuit is determined by resistor 58 and resistor 60. Capacitor 62 provides an ac ground across resistor 56 so that no ac voltage changes are produced across resistor 56 causing it to function strictly as a biasing resistor. Feedback path 54 utilizes a feedback resistor 64 and a feedback capacitor 66 to provide negative feedback from the output of transistor 70 to the input node 48. Inherent capacitance 68 appears at high frequencies between the collector and base leads of transistor 50. The impedance value of inherent capacitance 68 decreases as the frequency of the input increases causing a decrease in the response of the circuit. The cascode configuration mitigates the effect of capacitance 68.

Figure 3:
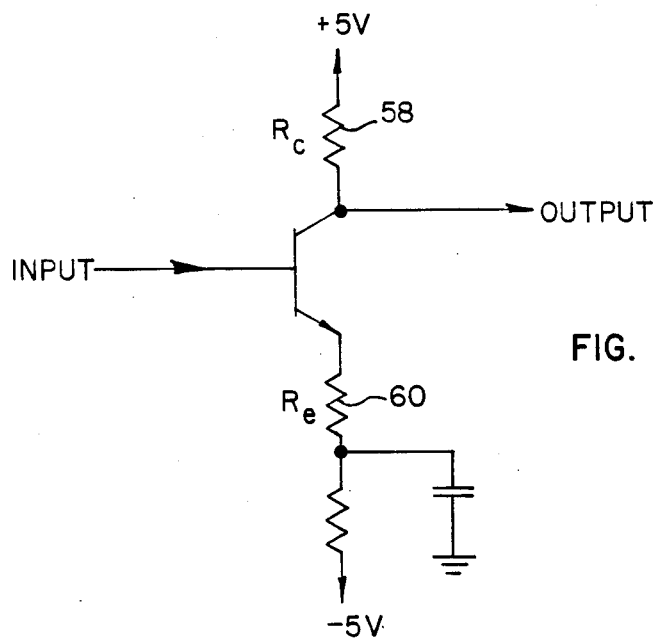
FIG. 3 comprises a schematic diagram illustrating the effect of emitter degeneration in the first amplification stage.

FIG. 3 is a schematic circuit diagram illustrating the manner in which emitter degeneration precisely controls the gain of the first amplification stage 20 illustrated in FIG. 2. FIG. 3 schematically illustrates the portions of the first amplification stage 20 which provide emitter degeneration. In general, the ac gain of the circuit is set by $R_c/R_e$. $R_e$ is selected to control the base current and, consequently, control the collector current flowing through $R_c$. The collector current flowing through $R_c$ produces the ac voltage gain at the output. Consequently, control of the base current by emitter degeneration is accomplished through selection of $R_e$ which stabilizes the base current and sets the collector current so that the gain of the circuit can be selected by selection of $R_c$. In other words, the voltage drop across $R_c$ is set by the emitter current minus the base current multiplied by $R_c$. The emitter current is controlled by $R_e$ so that the voltage drop across $R_c$ is controlled by $R_e$.

Figure 4:
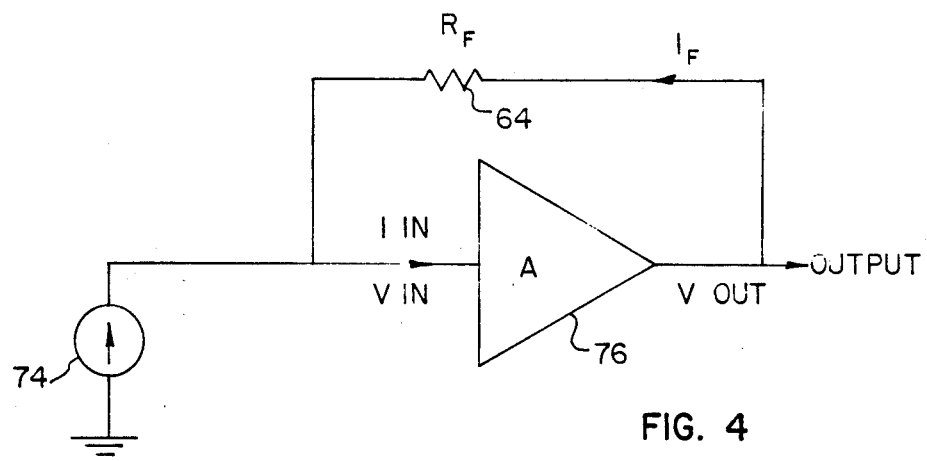
FIG. 4 is a schematic circuit diagram illustrating the effect of negative feedback in the first amplification stage.

FIG. 4 illustrates the effect of negative feedback provided by the first amplification circuit 20 illustrated in FIG. 2. Pin diode 10 can be considered to be a constant current source 74 for the purposes of this discussion. Constant current source 74 injects a current into amplifier 76 having a predetermined gain A which is equal to the gain provided by the cascode configuration of the transistor pair of first amplification stage 20. In the present circuit, this gain is approximately equal to 10. The input impedance ($R_A$) of amplifier 76 is high so that the injected current causes the voltage ($V_{in}$) at the input to amplifier 76 to rise by a factor of $I_{in} \times R_A$. The output voltage $V_{out}$ at the output of amplifier 76 is equal to $-A \times I_{in} \times R_A$ since the output of amplifier 76 is inverting. This causes a large flow of feedback current $I_F$ which tends to stabilize the circuit and reduce the input current ($I_{in}$) to amplifier 76. The net effect is that the input impedance to the amplifier circuit is reduced which greatly increases the response time of pin diode 10 and, consequently, the response time and frequency response of the receiver circuit 10. The input impedance of the receiver circuit is $R_A$ (the impedance of amplifier 76) in parallel with $R_F$ divided by A. Consequently, the input impedance of the first amplification stage 20 is directly controlled by the amplification factor (A) which can be precisely set by the selection of resistors 58 and 60, due to the effect of emitter degeneration.

Consequently, the combined use of emitter degeneration and negative feedback provides an ability to control the frequency response of the first amplification stage 20. Emitter degeneration is used to control the overall amplifier gain and by setting the overall amplifier gain, the input impedance is positively controlled by negative feedback. Stated in different terms, emitter degeneration sets the amplifier gain (A) of transistor pair 50, 70. Negative feedback provides a lower input impedance by a factor proportional to $R_F/A$. Since A can be precisely controlled by the selection of resistors 58, 60, precise control is provided over the input impedance once $R_F$ is selected. This allows unit to unit repeatability of frequency response because of the controlled input impedance of the circuit.

Figure 5:
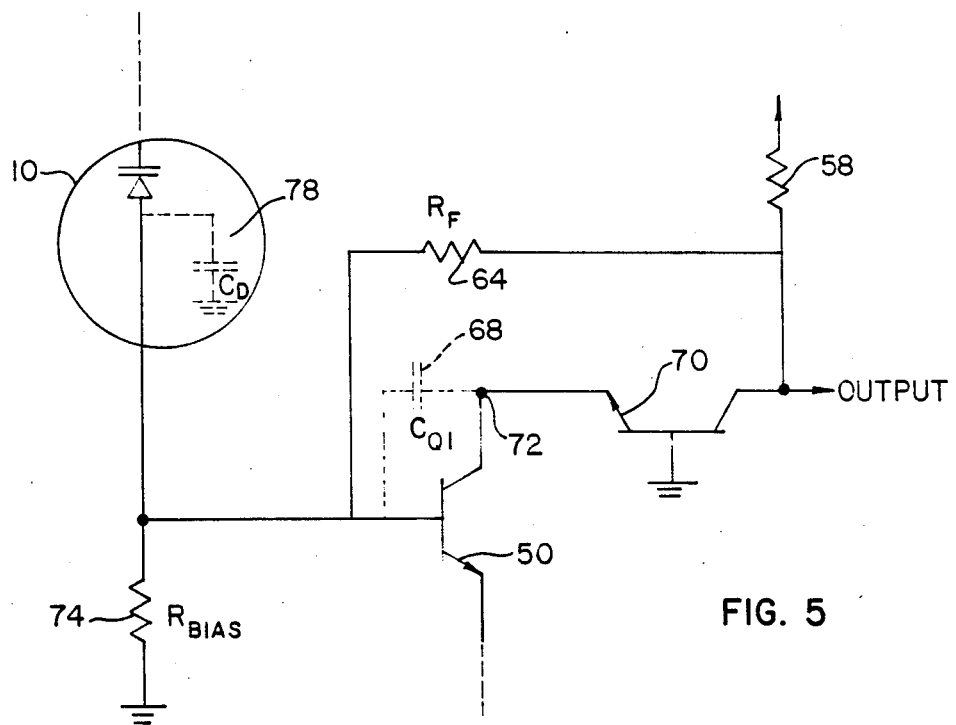
FIG. 5 is a schematic circuit diagram illustrating the effect of virtual capacitance in the first amplification stage.

FIG. 5 comprises a schematic diagram illustrating the inherent capacitance 68 having a value $C_{Q1}$ produced between the base and emitter leads of transistor 50. An inherent capacitance 78 having a value $C_D$ is also produced in PIN diode 10. The cascode configuration of transistor pair 50, 70 increases the frequency response of the amplification stage 20 illustrated in FIG. 5. The cascode configuration holds the voltage at node 72 constant by isolating node 72 from voltage changes at the output produced across voltage gain resistor 58 and feedback resistor 64. Although the current passing through node 72 varies in accordance with variations in the input produced by pin diode 10, no voltage changes are produced at node 72 due to the isolation provided by cascode pair 50, 70. Consequently, by holding the voltage at node 72 at a constant dc level, ac feedback through virtual capacitance 68 is limited due to the lack of change in voltage. The result of holding the voltage constant at node 72 is equivalent to tying the inherent capacitance 68 to ground potential and thereby minimize its effect.

Figure 6:
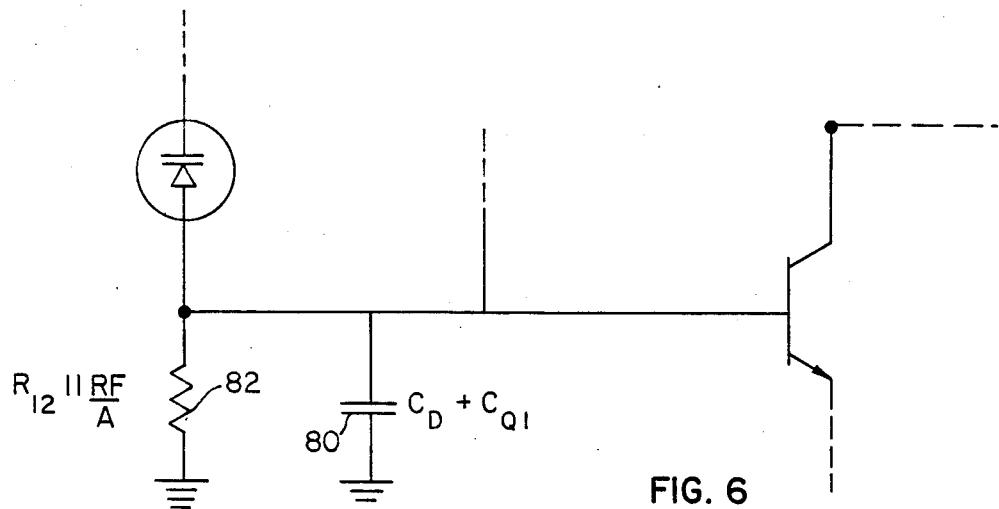
FIG. 6 is schematic circuit diagram of an equivalent circuit illustrating the effects of a virtual capacitance.

FIG. 6 illustrates an equivalent circuit showing the effect of inherent capacitance 68, 78. The effect of this capacitance is a single capacitance 80 tied to ground having a value equal to the sum of the capacitance of inherent capacitance 78 and inherent capacitance 68. This is combined in parallel with a resistance 82 having a value equal to the resistance ($R_{Bias}$) of resistor 74 in parallel with $R_F/A$. The RC time constant of resistance 82 and capacitance 80 is extremely small due to the resistance and capacitive values of these components which have been minimized by the design of the circuit.

Figure 7:
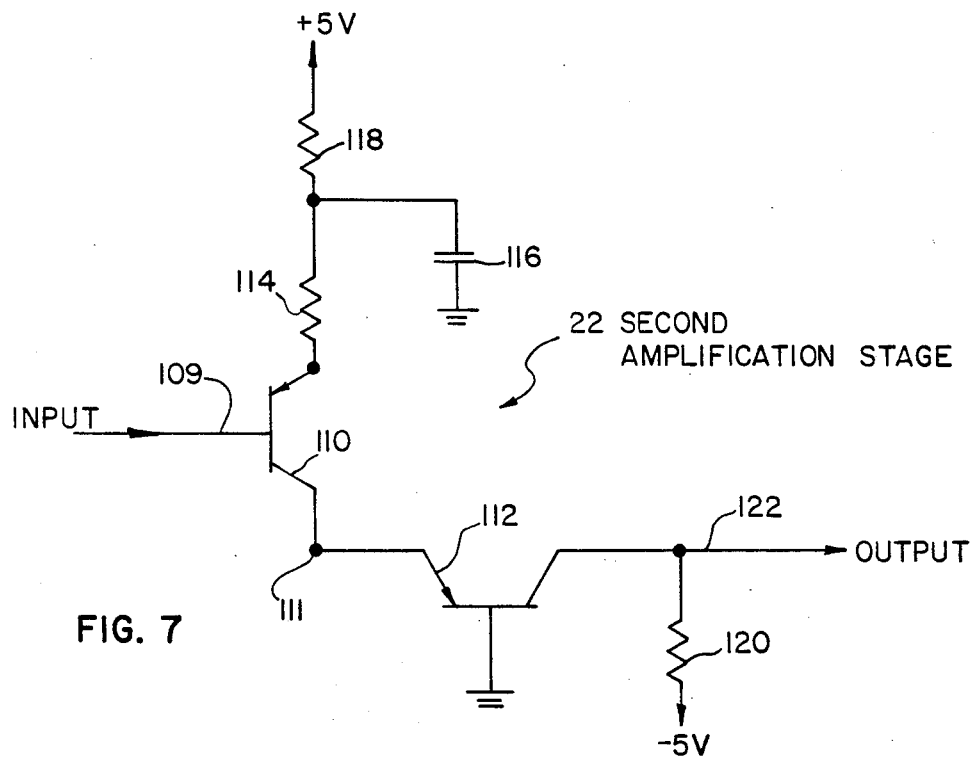
FIG. 7 is a schematic circuit diagram of the second amplification stage 22 of the present invention.
Figure 8:
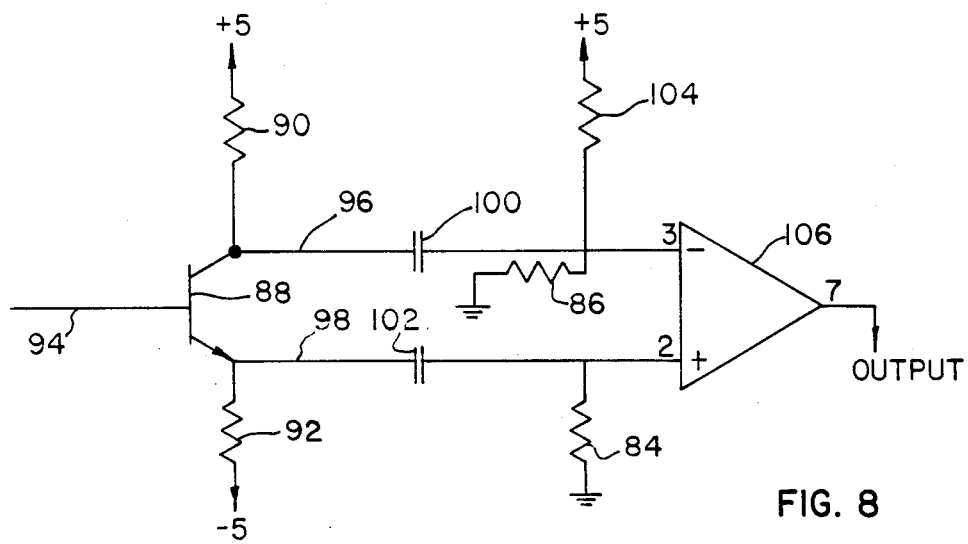
FIG. 8 is a schematic circuit diagram of the impedance converter and comparator circuits of the present invention.

FIG. 7 schematically illustrates the impedance converter stage of the receiver circuit of the present invention. It is extremely desirable to have a low output impedance provided by the circuitry connected to the comparator circuit to limit the effects of stray capacitance between the output (pin 7) and the inputs (pins 2 and 3) of the comparator. Stray capacitance between the output and input causes the comparator circuit to oscillate in an undesirable manner at high frequencies as a result of the high input impedance of the comparator circuit. This problem is eliminated by reducing the resistance at the input to the comparator by tying the input to ground with a low value resistance, such as that provided by loading resistors 84, 86. Resistors 84, 86 typically have a value of around 250 ohms. However, to ensure the proper gain from the second amplification stage, the next stage of the receiver should have a high input impedance. Consequently, an impedance converter is required to provide a high input impedance at the output of the second amplification stage and a low output impedance at the input of the comparator circuit. As illustrated in FIG. 8, transistor 88 is configurated as an emitter follower to provide such an impedance conversion. The output of the second amplification stage is applied to the base lead 94 of transistor 88. Resistors 90, 92 provide a unity gain from transistor 88 at collector lead 96 and emitter lead 98. Blocking capacitors 100, 102 block the direct coupled biasing voltage which runs throughout the various stages of the receiver circuit. Loading resistors 84, 86 comprise low value resistors which load down the input to comparator circuit 106. Resistor 104 comprises a threshold resistor having a very high value, e.g., 56 k to set the threshold level of comparator circuit 106. The impedance converter circuit not only provides isolation between the second amplification stage and comparator 106, but also provides 6 db additional gain.

Comparator 106 is a low offset, high speed, TTL compatible output integrated circuit. The inverting input on pin 3 is biased up with reference to ground in order to provide a threshold below which the receiver will not respond to optical signals. This bias can be varied by adjusting the value of resistor 104.

FIG. 7 is a schematic diagram illustrating the components of the second amplification stage 22. As set forth previously, second amplification stage 22 is direct biascoupled to the first amplification stage to eliminate additional biasing resistors. The output from the first amplification stage is applied to input 109 of the second amplification stage 22 comprising the base lead of transistor 110. Transistor 110 and transistor 112 form a cascode configuration in which node 111 is maintained at a constant voltage. In this manner, virtual capacitance between the collector and base leads of transistor 110 is minimized in the same manner as described for the first amplification stage. Resistor 114 comprises a biasing resistor which is ac grounded by capacitor 116. Resistor 118 functions in conjunction with resistor 120 to provide voltage gain at output 122 which is precisely controlled by the effect of the emitter degeneration by the values of resistors 118, 120 in the manner described above.

The performance of the receiver circuit indicates a high-frequency roll off point of 6.5 MHz. The high-frequency roll off point is determined by the current gain-bandwidth of the transistors used in the first and second stage amplifiers. Other non-dominant points are caused by the capacitance of the first and second stage amplifiers in conjunction with collector load impedances. The low-frequency roll off point is approximately 15.9 kHz which is determined by the emitter resistor/capacitor network of the second stage amplifier consisting of resistor 114 and capacitor 116. Other non-dominant points are caused by resistor 60 and capacitor 62 and capacitor 102 in conjunction with resistor 84.

The supply current needed for the receiver circuit in the absence of any input is ±2.5 milliamps for the discreet stages and 16 milliamps plus and 18 milliamps minus for the comparator. These values do not vary significantly with an input signal since only the discreet stages have a duty cycle dependent current consumption. The switching current on the comparator's totumpole output varies with signal frequency, but not in a significant manner.

FIG. 8 is a schematic diagram of the transmitter circuit 124. The transmitter circuit utilizes a 75453 integrated circuit 126. Integrated circuit 126 comprises a TTL open collector driver circuit which is typically used as a peripheral driver. For example, integrated circuit 126 can be used to drive print heads on a printer device. Integrated circuit 126 receives TTL input 128 from a device such as a computer which comprise a pulse 1 signal 130 which is applied to pin 7, a disable signal 132 which is applied to pins 6 and 2, a pulse 2 signal 134 which is applied to pin 1, and a ground signal 136 which is applied to pin 4. The driver output on pin 8 of integrated circuit 126 is applied to a capacitive network 138 which is connected between a 5 volt supply voltage and ground potential. Capacitive network 138 comprises supply filtering capacitors which filter the 5 volt dc supply voltage. Current limiting resistor 142 biases the current through the infrared LED 140 operating at 820 nanometers. The ir LED is pigtailed to the transmitting fiber in the manner described in the above-identified U.S. patent application.

Figure 9:
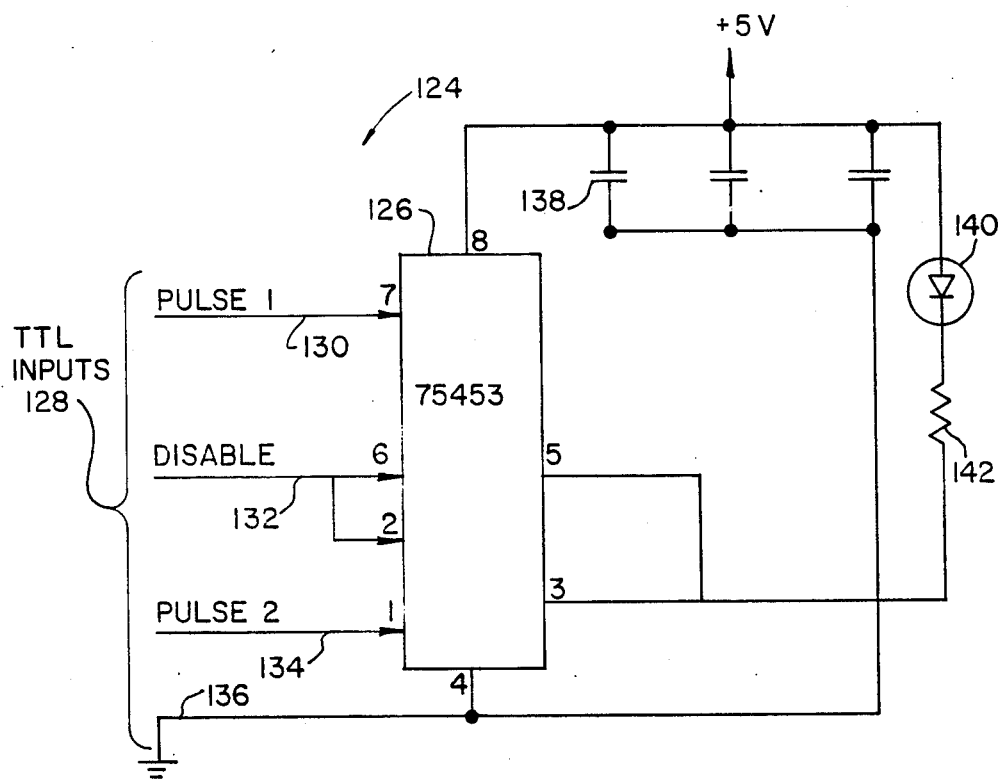
FIG. 9 is a schematic circuit diagram of the transmitter circuit of the present invention.
Figure 10:
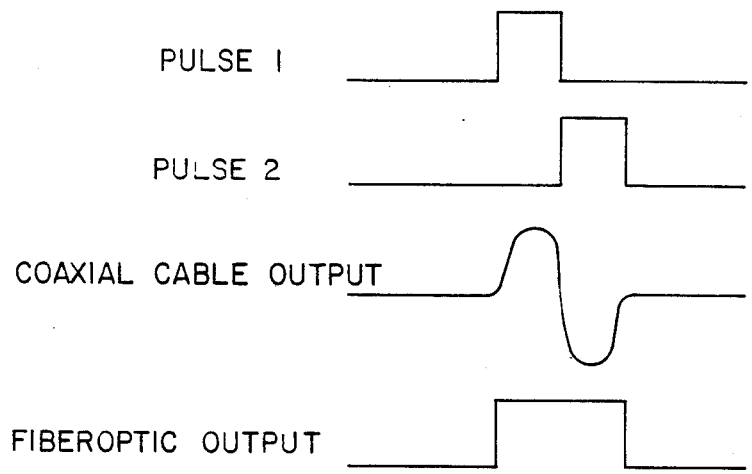
FIG. 10 is a graph schematically illustrating various pulse configurations.

FIG. 9 comprises a pulse diagram of typical input and output pulses. The pulse 1 and pulse 2 signals comprise consecutive digital signals from TTL input 128. A typical co-axial driver in a local area network device produces a co-axial cable output, such as illustrated in FIG. 10. The transmitter circuit illustrated in FIG. 9 produces a fiber optic output signal comprising a single output pulse, such as illustrated in FIG. 10. Integrated circuit 126 of FIG. 8 is driven with the standard TTL input levels of pulse 1 and pulse 2, and when enabled, will turn on LED 140 when either or both of the two input lines are low.

Figure 11:
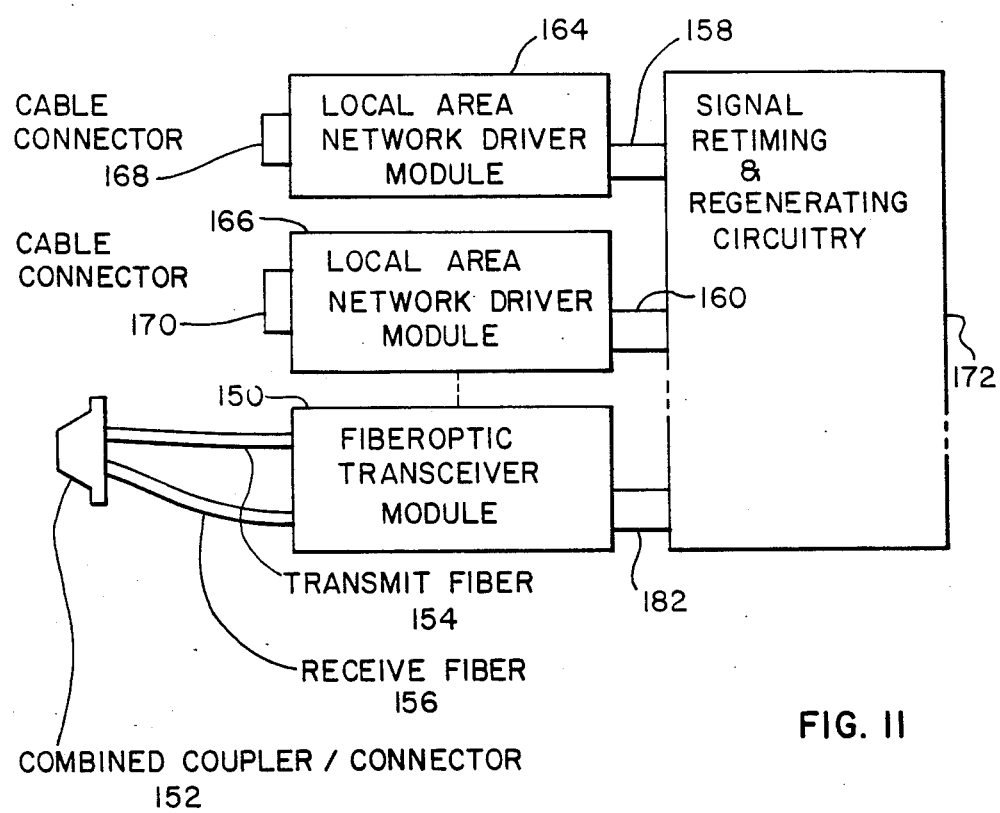
FIG. 11 is a schematic block diagram of an active local area network hub employing the fiber optic transceiver module of the present invention.

FIG. 11 is a schematic block diagram of an active local area network hub employing the fiber optic transceiver module of the present invention. The fiber optic transceiver module 150 comprises the receiver circuit illustrated in FIG. 1 and the transmitter circuit illustrated in FIG. 9. The fiber optic transceiver module 150 employs a combined coupler connector 152, such as disclosed in the above-identified application which functions to both couple and connect transmit fiber 154 and receive fiber 156 to a single fiber optic link cable. Three connector devices 158, 160, 162 are illustrated in FIG. 11 for connecting communication modules to the active hub to provide communication ports. The active local area network hub can be designed for any desired number of communication ports. As illustrated in FIG. 11, two local area network driver modules 164, 166 are connected to the hub to provide cable communications within the local area network. The fiber optic transceiver module 150 has been designed to have a pin configuration which is compatible with the hub to provide ready modification of the hub to provide one or more fiber optic communication ports. Local area network driver modules 164, 166 communicate in the local area network by way of co-axial cables which are connected to cable connectors 168, 170, respectively. Each of the connector devices 158, 160, 162 can employ a standard pin configuration such as a 20 pin configuration used by the ARCNET local area network device which is in common use in the computer industry. Each of these connectors is connected to signal retiming and regenerating circuitry 172 which is contained within the active local area network hub.

Signal retiming and regenerating circuitry 172 functions in a similar manner to the physical layer of the open system interconnect as defined by the International Standards Organization. The physical layer communicates with the data link layer in a conventional terminal device. By implementing the physical layer of the open system interconnect, the fiber optic transceiver module of the present invention can be employed directly in a terminal device and communicate directly with the data link layer. This allows the fiber optic transceiver module to be placed directly in a terminal device to provide a fiber optic communication port and therefore replace the physical layer of open system interconnect. This is accomplished with very little modification of the terminal device since the fiber optic transceiver module is designed to communicate directly with the data link layer.

Consequently, the transmitter circuit uses a standard TTL peripheral driver integrated circuit to drive an ir LED to produce a fiber optic output signal. The present invention, therefore, provides both a receiver and transmitter circuit in a connector compatible device which can be readily employed in a local area networking device. The device minimizes components by using direct bias coupling between stages to ensure compatibility with the local area network device. Desirable frequency response is achieved by the use of a cascode transistor pair configuration in both the first and second stages of amplification which eliminates virtual capacitance generated between collector and base leads of the transistor by holding the collector lead at a constant voltage. Both negative feedback and emitter degeneration are also employed in the cascode pair configuration of the first amplification stage which allows precise control over the input impedance of the circuit allowing unit to unit repeatability of frequency response. This is extremely advantageous in a production environment where repeatability of response parameters from unit to unit must be readily and economically achieved. Additionally, the impedance converter functions in conjunction with the comparator to provide not only impedance conversion between the second amplification stage and the comparator, but also a 6 db gain.

Figure 12:
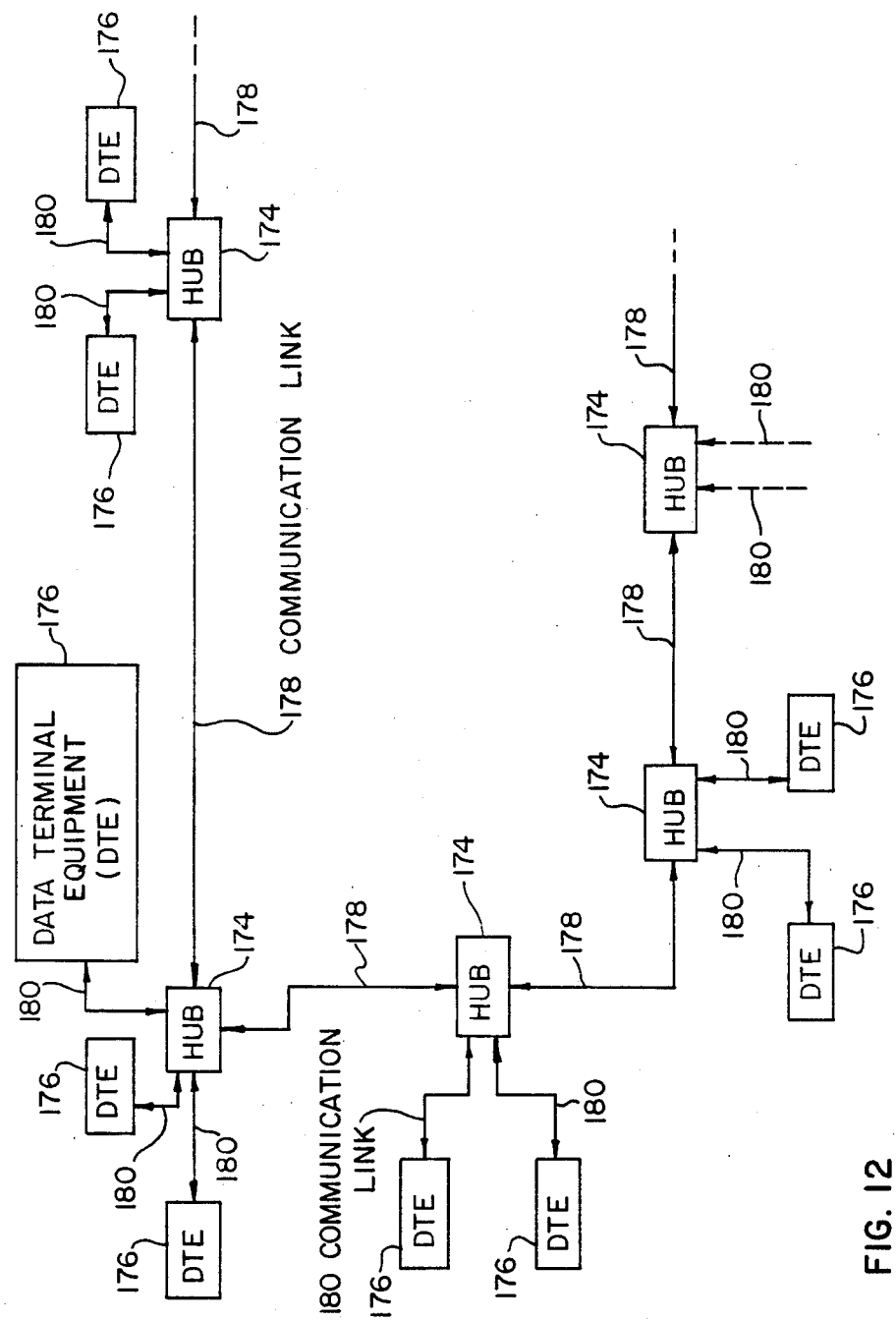
FIG. 12 is a schematic block diagram which illustrates the topology of a token bus network.

FIG. 12 discloses the token bus topology of a token bus network. A plurality of hubs 174 are connected by communication links to adjacent hubs to bidirectionally transmit information between hubs 174. In accordance with the present invention, communication links 178 can comprise a single fiber optic link cable. Alternatively, communication links 178 can comprise a mixture of fiber optic link cables and other communication link devices such as coaxial cables, twisted pairs or other wire connectors. A plurality of data terminal equipment (DTE) are bidirectionally coupled to hubs 174 by way of communication link 180 to communicate information through the token bus network. In accordance with the present invention, DTEs 176 communicate with hub 174 over a single fiber optic link cable. Alternatively, a mixture of FOCMs and other communication means such as local area network drivers (LANDs) employing coaxial cables can be used to communicate information between DTEs 176 and hubs 174. The token bus network illustrated in FIG. 12 communicates using half duplex communication. Each of the communication links 178, 180 provides bidirectional communication between hubs and DTEs and between hubs. The half duplex communication between hubs 174 and between DTEs 176 and hubs 174 only permits non-simultaneous communication of information.

Figure 13:
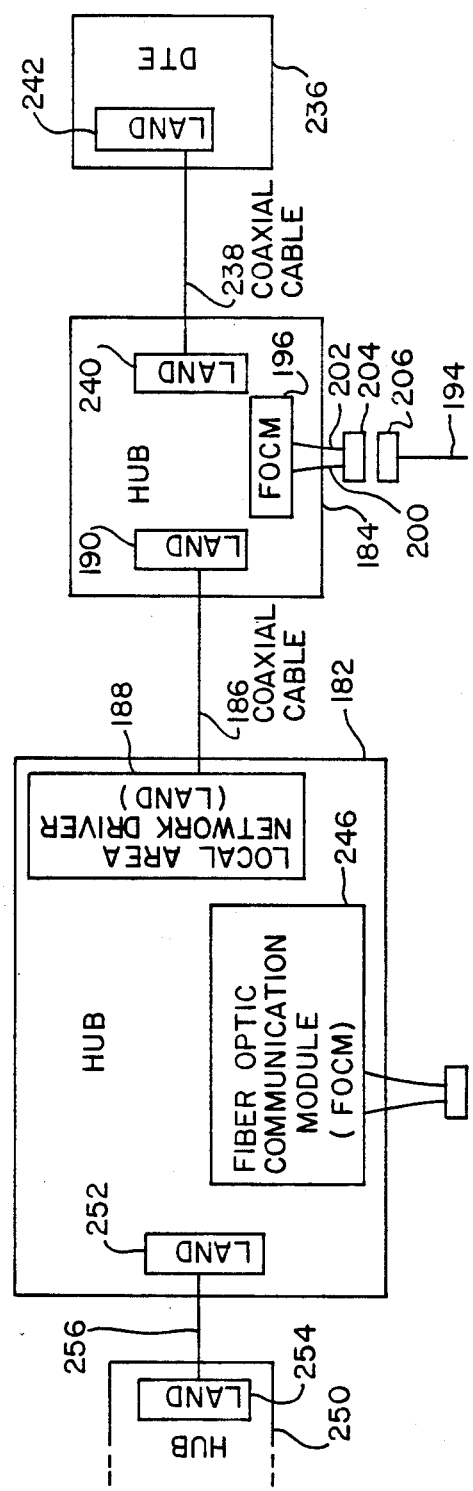
FIG. 13 is a schematic block diagram illustrating the use of the fiber optic communication module of the present invention in a token bus network such as illustrated in FIG. 12.
Figure 13:
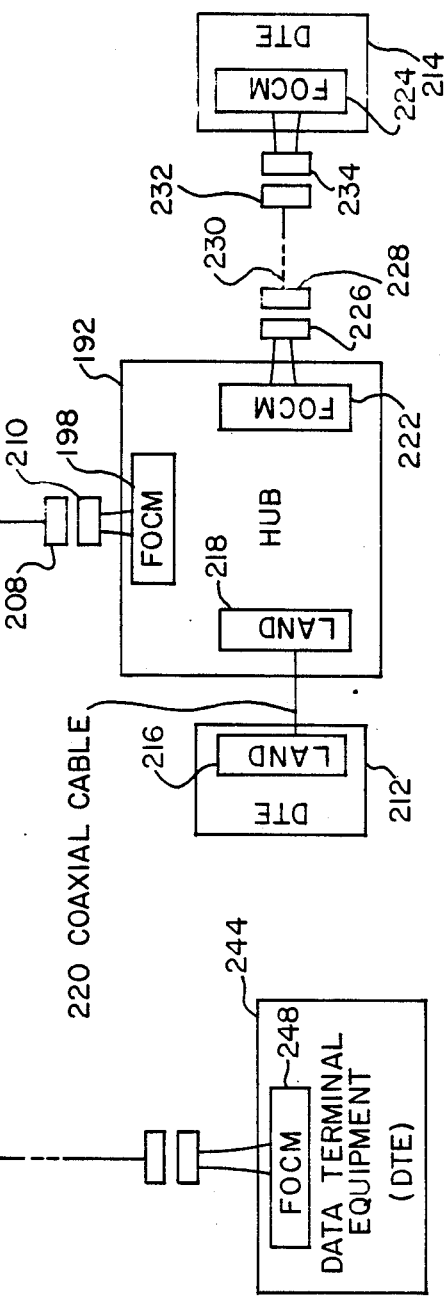

FIG. 13 is a detailed schematic diagram illustrating the use of fiber optic communication modules (FOCM) in the token bus network of FIG. 12. As illustrated in FIG. 13, hubs 182 and 184 are connected by coaxial cable 186 which communicates data between local area network driver (LAND) 188 and LAND 190. Alternatively, hub 184 is connected to hub 192 by a single fiber optic link cable 194 which communicates data between fiber optic communication module 196 of hub 184 and fiber optic communication module 198 of hub 192. Transmit fiber 200 and receive fiber 202 are connected to coupler/connector 204 which is coupled to coupler/connector 206 for bidirectionally communicating data on fiber optic link cable 194. Similar coupler/connectors 208, 210 are provided between fiber optic link cable 194 and fiber optic communication module 198. Hub 192 communicates with DTE 212 and DTE 214. Local area network drivers 216, 218 provide communications between DTE 212 and hub 218 by way of coaxial cable 220. Hub 192 communicates with DTE 214 by way of FOCM 222 and FOCM 224 via fiber optic link cable 230 and connectors 226, 228 and connectors 232, 234. Hub 184 communicates with a single DTE 236 via coaxial cable 238 between LAND 240 disposed in hub 184 and LAND 242 disposed in DTE 236. Hub 182 provides bidirectional fiber optic communication between hub 182 and DTE 244 using FOCM 246 disposed in hub 182 and FOCM 248 disposed in DTE 244. Hub 250 is connected to hub 182 by way of coaxial cable 256 between LAND 254 disposed in hub 250 and LAND 252 disposed in hub 182.

Consequently, any desired combination of LANDs and FOCMs can be used in hubs and DTEs to provide the desired bidirectional communication to be used in the token bus network illustrated in FIG. 12. The FOCMs of the present invention have been designed to be both connector and size compatible with local area network drivers to provide an easy and readily obtainable means for interchanging LANDs and FOCMs in both hub devices and DTEs. In this manner, the user of the token bus network can design the local area network to provide the most desirable system for the particular use contemplated. For example, in areas where security of transmission is desired and/or protection from radio frequency interference is desired, fiber optic communication link cables can be used.

Figure 14:
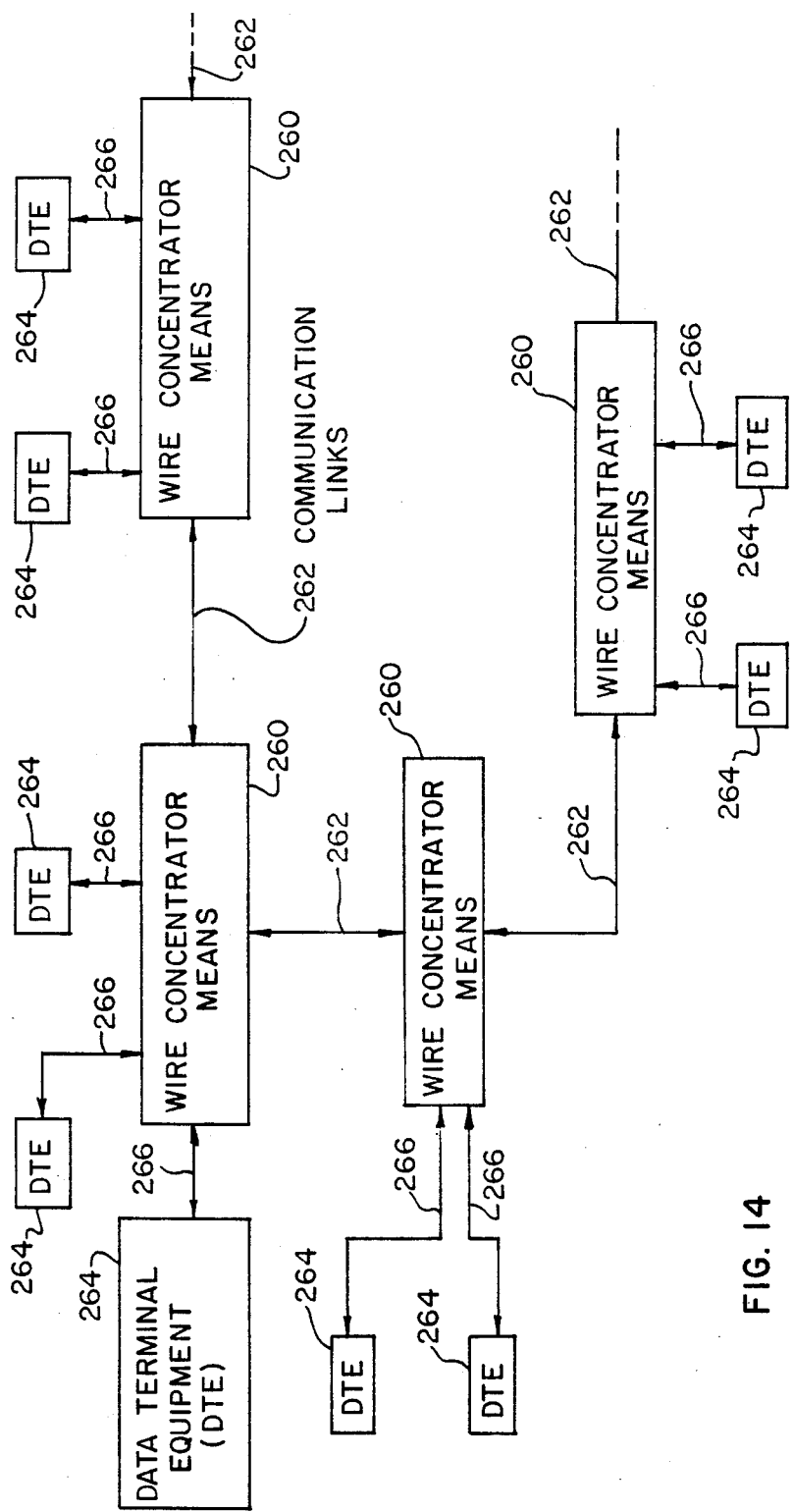
FIG. 14 is a schematic block diagram illustrating the topology of a token ring network.

FIG. 14 is a schematic block diagram of a token ring network. A plurality of wire concentrator means 260 are connected by communication links 262. Communication links 262 can comprise a single fiber optic communication link cable or other communication link devices such as dual coaxial cables or dual twisted pairs, etc. or a combination of fiber optic link cables and other communication link devices capable of providing simultaneous bidirectional communication between wire concentrator means 260. In a similar manner, DTEs 264 are connected to wire concentrator means 260 by way of communication links 266 which can comprise a single fiber optic link cable or other communication link devices such as dual coaxial cables, dual twisted pairs, etc. or any combination thereof. Communication links 266 provide simultaneous bidirectional communication between DTEs 264 and wire concentrator means 260 in a full duplex manner of communication.

Figure 15:
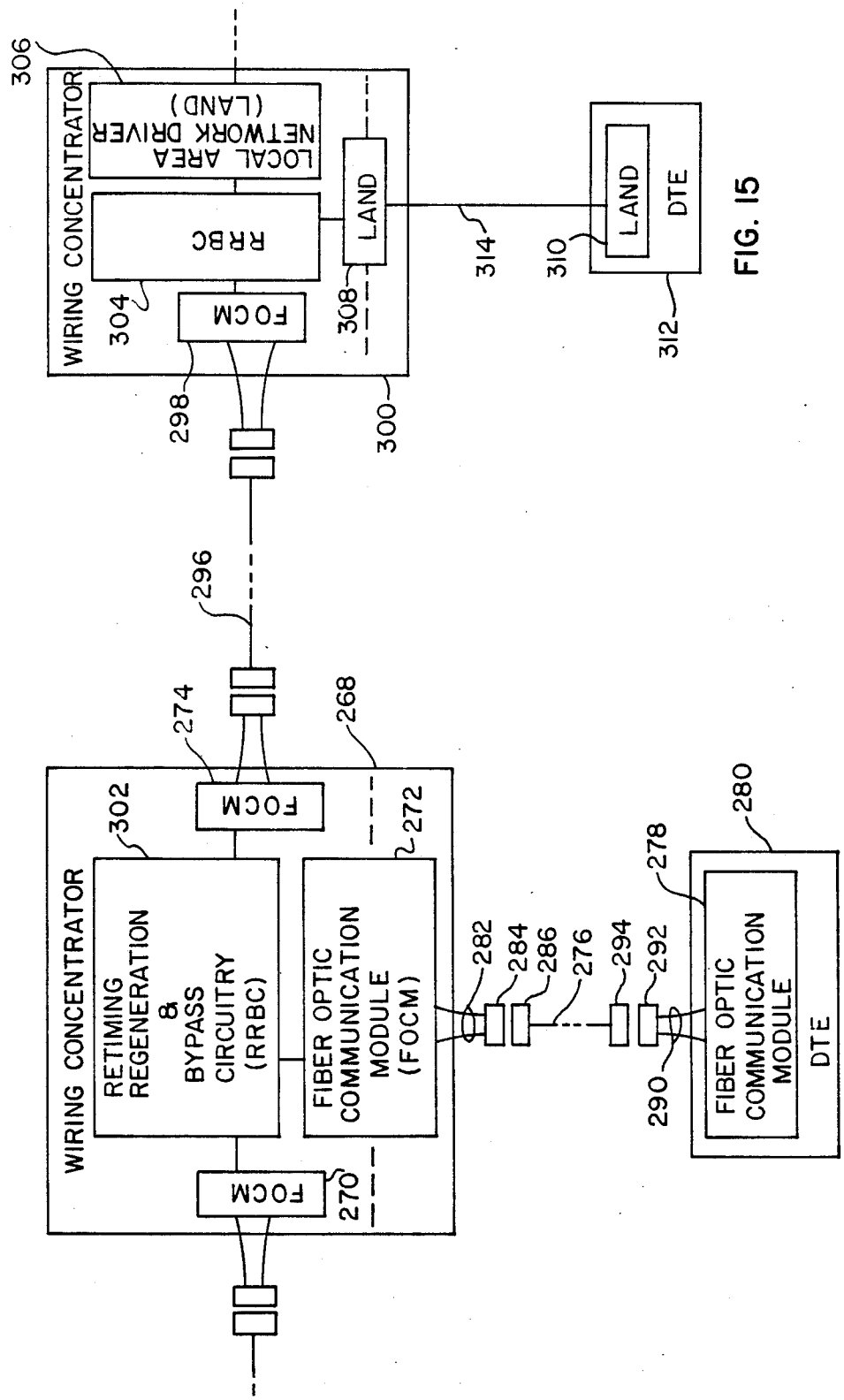
FIG. 15 is a schematic block diagram illustrating the use of the fiber optic communication module of the present invention in a token ring network such as illustrated in FIG. 14.

FIG. 15 comprises a schematic block diagram of the manner in which fiber optic communication modules (FOCM) and local area network drivers (LANDs) can be utilized in both wire concentrator means 260 and DTEs 264. As illustrated in FIG. 15, wire concentrator means 268 utilizes three FOCMs 270, 272, 274 for communicating between other wire concentrators and DTEs. FOCM 272 provides simultaneous bidirectional communication over single fiber optic link cable to FOCM 278 disposed in DTE 280. Transmit and receive fibers 282 couple information to single fiber optic link cable 276 via combined coupler connectors 284, 286. Similarly, transmit and receive fibers 290 couple information to single fiber optic link cable 276 for simultaneous bidirectional communication by way of combined coupler/connectors 292, 294. Similarly, simultaneous bidirectional communication between FOCM 274 disposed in wire concentrator 276 and FOCM 298 disposed in wire concentrator 300 is provided over single fiber optic link cable 296. FOCMs 270, 272 and 274 are each connected to retiming, regeneration and bypass circuitry (RRBC) 302 which provides the proper processing of information within wire concentrator 276. Similarly, RRBC 304 provides processing of information between FOCM 298, local area network driver (LAND) 306 and LAND 308 in wire concentrator 300. LAND 308 provides simultaneous bidirectional communication of information to LAND 310 disposed in DTE 312 by way of wire connector 314 which can comprise dual coaxial cables, dual twisted pairs, or other wire connector means. FOCM 270 can be connected to an additional wire concentrator or DTEs. LAND 306, similarly, can be connected to additional wire concentrators or DTEs.

Consequently, any desired arrangement of LANDs and FOCMs can be disposed in wire concentrators and DTEs to provide the desired token ring network configuration since the FOCM device is both size and connector compatible with the LAND device in both DTEs and wire concentrators. In this manner, the token ring network can be designed for the particular application in which it is used.

It is contemplated that the inventive concepts herein described may be variously otherwise embodied and it is intended that the appended claims be construed to include alternative embodiments of the invention except insofar as limited by the prior art.

What is claimed is:

1. A receiver circuit for a fiber optic receiver apparatus comprising:
    detector means for transforming optical input signals received on a fiber optic link cable into electrical signals;
    first amplifcation means for providing a first input impedance and a first predetermined amplification of said electrical signals comprising:
    a first pair of transistors arranged in a cascode configuration for providing a high frequency response of said first amplification means by minimizing the effects of virtual capacitance in said transistor pair;
    emitter degeneration means connected to one of said transistors for precisely controlling gain of said cascode configuration;
    negative feedback means connecting the output with the input of the transistor pair for precisely controlling input impedance of said first amplification stage in response to said gain of said cascode configuration to provide a uniform response of said receiver circuit for response variations of said detector means;
    second amplification means for providing a second predetermined amplification of said electrical signals, said second amplification means having a second cascode transistor pair configuration connected to said first pair of transistors for providing a high frequency response of said amplification means by minimizing effects of virtual capacitance in said second transistor pair;
    impedance converter means for providing a high input impedance to said second amplification stage, a low output impedance and a predetermined amplification of said electrical signals and further comprising a common emitter configuration having a collector and emitter output; and
    comparison means connected to the collector and emitter output for producing an output signal whenever the electrical signals from said converter means exceed a predetermined threshold level.

* * * * *